United States Patent
O'Neill

(10) Patent No.: US 9,660,123 B2
(45) Date of Patent: May 23, 2017

(54) FRESNEL LENS SOLAR CONCENTRATOR CONFIGURED TO FOCUS SUNLIGHT AT LARGE LONGITUDINAL INCIDENCE ANGLES ONTO AN ARTICULATING ENERGY RECEIVER

(71) Applicant: Mark Joseph O'Neill, Keller, TX (US)

(72) Inventor: Mark Joseph O'Neill, Keller, TX (US)

(*) Notice: Subject to any disclaimer, the term of this patent is extended or adjusted under 35 U.S.C. 154(b) by 0 days.

(21) Appl. No.: 13/975,338

(22) Filed: Aug. 25, 2013

(65) Prior Publication Data

US 2015/0053253 A1    Feb. 26, 2015

(51) Int. Cl.
| | | |
|---|---|---|
| H01L 31/054 | (2014.01) |
| F24J 2/08 | (2006.01) |
| F24J 2/07 | (2006.01) |
| B64G 1/44 | (2006.01) |
| G02B 3/08 | (2006.01) |

(52) U.S. Cl.
CPC .......... *H01L 31/0543* (2014.12); *B64G 1/443* (2013.01); *F24J 2/085* (2013.01); *F24J 2002/075* (2013.01); *G02B 3/08* (2013.01); *Y02E 10/52* (2013.01)

(58) Field of Classification Search
None
See application file for complete search history.

(56) References Cited

U.S. PATENT DOCUMENTS 5,505,789 A * 4/1996 Fraas et al. ............. 136/246
6,031,179 A   2/2000 O'Neill
6,075,200 A   6/2000 O'Neill
2009/0250094 A1 * 10/2009 Robison et al. ............. 136/246

OTHER PUBLICATIONS

Mark J. O'Neill et al., "Stretched Lens Array SquareRigger (SLASR) Technology Maturation," 19th Space Photovoltaic Research and Technology Conference (SPRAT XIX), Sep. 20 to 22, 2005, Cleveland, Ohio.
Mark J. O'Neill et al., "Stretched Lens Array (SLA) for Solar Electric Propulsion (SEP)," 20th Space Photovoltaic Research and Technology Conference (SPRAT XX), Sep. 25-27, 2007, Cleveland, Ohio.

* cited by examiner

*Primary Examiner* — Jennifer Michener
*Assistant Examiner* — Christopher Danicic
(74) *Attorney, Agent, or Firm* — Hulsey, P.C.

(57) ABSTRACT

This invention includes a Fresnel lens assembly positioned relative to an energy receiver, onto which the lens assembly focuses sunlight for collection and conversion. The Fresnel lens assembly includes a thin polymeric film with prisms molded into or attached to the film. This invention also includes an articulating energy receiver which can move closer to or farther away from the lens depending on the longitudinal angle of incidence of the sunlight relative to the lens, to maintain the best focus of sunlight on the energy receiver. The prisms in the present lens are specified to provide acceptable optical performance in the presence of relatively large longitudinal solar incidence angles, relatively smaller lateral solar incidence angles, in combination with the articulating energy receiver. The new lens assembly can further be deployed and supported as a thin flexible stretched membrane with tension maintaining the lens in proper position on orbit.

17 Claims, 5 Drawing Sheets

US 9,660,123 B2

FRESNEL LENS SOLAR CONCENTRATOR CONFIGURED TO FOCUS SUNLIGHT AT LARGE LONGITUDINAL INCIDENCE ANGLES ONTO AN ARTICULATING ENERGY RECEIVER

CROSS REFERENCE TO RELATED APPLICATION

The present non-provisional application for patent was previously submitted to the U.S. Patent and Trademark Office as a provisional application, Application No. 61/696,199, filed on Sep. 2, 2012, with Confirmation No. 6728. The title, inventor, and disclosed invention were the same for the earlier provisional application as for this present non-provisional application. The inventor hereby claims the filing date of the earlier provisional application, namely Sep. 2, 2012.

BACKGROUND

The present inventor previously invented the Stretched Fresnel Lens for Space Power, as described in U.S. Pat. No. 6,075,200 (Reference 1). NASA and the U.S. Department of Defense have recognized the many advantages of this Stretched Lens Array (SLA) technology for space power, and have funded a number of R&D contracts totaling about $10,000,000 to develop, test, mature, and fly SLA technology (References 2 and 3). SLA offers dramatic improvements in all of the critical performance metrics for space solar arrays, including lower cost ($/Watt of array power output), higher specific power (Watts/kilogram of array mass), higher stowed power (Watts/cubic meter of launch volume), improved photovoltaic cell radiation hardness (due to smaller cell sizes, allowing thicker radiation shielding at lower mass penalty), and higher voltage operation (again due to the smaller cell sizes, allowing thicker dielectric insulation at lower mass penalty).

However, the previously patented version of SLA is substantially limited to relatively small (e.g., <15 degrees) longitudinal incidence angles of sunlight, typically called beta ($\beta$) angles in the space solar array industry. For many missions, however, the longitudinal incidence angles ($\beta$ angles) can be relatively large, and the existing SLA technology will not work well for such missions. For example, NASA is planning missions which will use solar electric propulsion (SEP) to transport spacecraft from low earth (LEO) orbit to higher orbit. For such missions, it is often desirable to use a non-equatorial launch site such as Cape Canaveral in Florida, resulting in a relatively large initial orbit inclination angle (e.g., 28 degrees). This large orbit inclination angle, coupled with seasonal variations in the sun-earth declination angle (±23.5 degrees) can resulting in longitudinal incidence angle ($\beta$ angles) of about 51 degrees (28 degrees+23 degrees) for a single-axis sun-tracking solar array. The existing SLA will not provide an acceptable focus of sunlight for such large $\beta$ angles. A new type of SLA is needed for such missions.

New multi-junction solar cells are being developed with four junctions and six junctions to improve the solar-to-electric conversion efficiency, but such cells are very expensive with projected costs of more than $10 per square centimeter of cell area. To enable near-term cost-effective use of such sophisticated solar cells, it is highly desirable to provide at least 4× or higher concentration ratio (lens aperture width divided by cell active width), to reduce the cell area and cost by about 75%. The cell efficiency also increases with concentration ratio, offsetting the lens transmittance loss, and making the combination of lens and cell even more cost-effective relative to one-sun planar arrays using the same cell technology.

The present invention is a new line-focus Fresnel lens solar concentrator which is configured to focus sunlight at large longitudinal incidence angles ($\beta$ angles) by using a unique prismatic geometry in combination with an articulating energy receiver to maintain a relatively high concentration ratio.

BRIEF SUMMARY OF THE INVENTION

This invention includes a Fresnel lens assembly positioned relative to an energy receiver, typically a multi-junction photovoltaic cell receiver, onto which the lens assembly focuses sunlight typically for conversion into electricity. The lens assembly includes a thin polymer film with microscopic prisms molded into or attached to the film forming a Fresnel lens. For space applications, the lens is typically made from space-qualified transparent silicone rubber material, such as Dow Corning DC 93-500® material. Special coatings are generally added to the outer sun-facing surface of the space lens to reject solar vacuum ultraviolet (VUV) radiation to prevent the polymer lens from darkening. Cords or wires can be embedded into or added to the lens to strengthen it for long-term space operation. This invention also includes an articulating energy receiver which can move closer to the lens or farther away from the lens depending on the longitudinal angle of incidence of the sunlight relative to the lens, to maintain the best focus of sunlight on the energy receiver. The prisms in the present lens are carefully specified to provide acceptable optical performance in the presence of relatively large longitudinal solar incidence angles, relatively smaller lateral solar incidence angles, in combination with the articulating energy receiver. The prisms can also be tailored to mix the wavelengths of light to provide higher multi-junction photovoltaic cell efficiency. The new lens assembly can further be deployed and supported as a thin flexible stretched membrane with tension maintaining the lens in proper position on orbit.

BRIEF DESCRIPTION OF THE DRAWINGS

FIG. 1 also includes ray traces through the lens onto the receiver for the three example values of the longitudinal solar incidence angle, as well as an example value of the lateral solar incidence angle, namely 4 degrees, corresponding to a sun-pointing error in this lateral direction. The Fresnel lens aperture width is 4.2 times larger than the energy receiver width for the embodiment of the present invention shown in FIG. 1, corresponding to a concentration ratio of 4.2×. The example angles of incidence are just examples of a full range of incidence angles through which the embodiment of the new invention shown in FIG. 1 can effectively operate.

Figure 1:
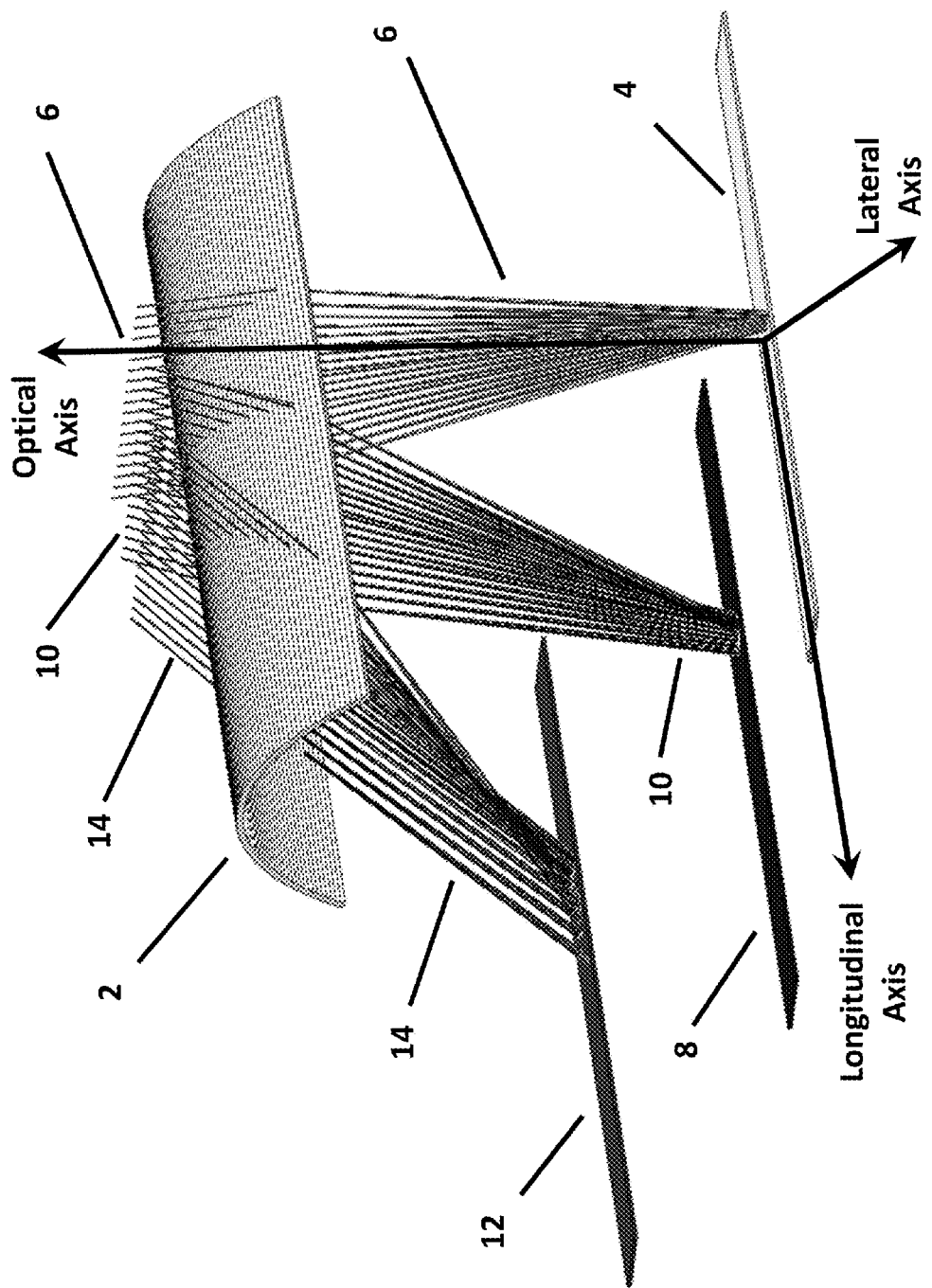
FIG. 1 presents a perspective view of the new Fresnel lens solar concentrator with its articulating energy receiver in three possible positions, corresponding to three example values of the longitudinal solar incidence angle, namely 0 degrees, 25 degrees, and 50 degrees.

To make the critical parts and their interrelationship more visible, the thickness of the lens and the size of the prisms have been greatly exaggerated in FIG. 1. In a real space solar array, these parts would be very thin, generally less than 0.010 inch (250 microns) in thickness.

In actual practice, as one of ordinary skill in the art would readily understand, multiple lenses and multiple photovoltaic receivers would be integrated into a larger solar array, but FIG. 1 shows the basic building block of a larger array. Furthermore, to make the functional parts more visible and to better show how the new invention operates, FIG. 1 shows the articulating energy receivers in varying longitudinal positions, which is not necessary for acceptable performance. Instead, the articulating energy receivers may only move upwards and downwards relative to the lens, and not lengthwise relative to the lens. The key functional requirement of the new invention is the adjustable distance from lens to the articulating energy receiver to provide the best focus for large longitudinal solar incidence angles.

After seeing the example embodiment of stiffeners in FIG. 1, those of ordinary skill in the art of space solar arrays will be able to understand and extend the new invention to other geometries and configurations. Still furthermore, while FIG. 1 shows a convex arch-shaped Fresnel lens, other lens geometries and configurations could be used, such as a flat Fresnel lens, albeit with reduced concentration ratio, but still falling within the scope and spirit of the new invention. Similarly, while the example embodiment in FIG. 1 shows the energy receiver moving relative to the lens, other embodiments may well have the lens moving relative to the energy receiver, providing the same advantages of the new invention. After seeing the example embodiment of the lens and articulating receiver in FIG. 1, those of ordinary skill in the art of space solar arrays will be able to understand and extend the new invention to other lens and receiver geometries and configurations.

Figure 2:
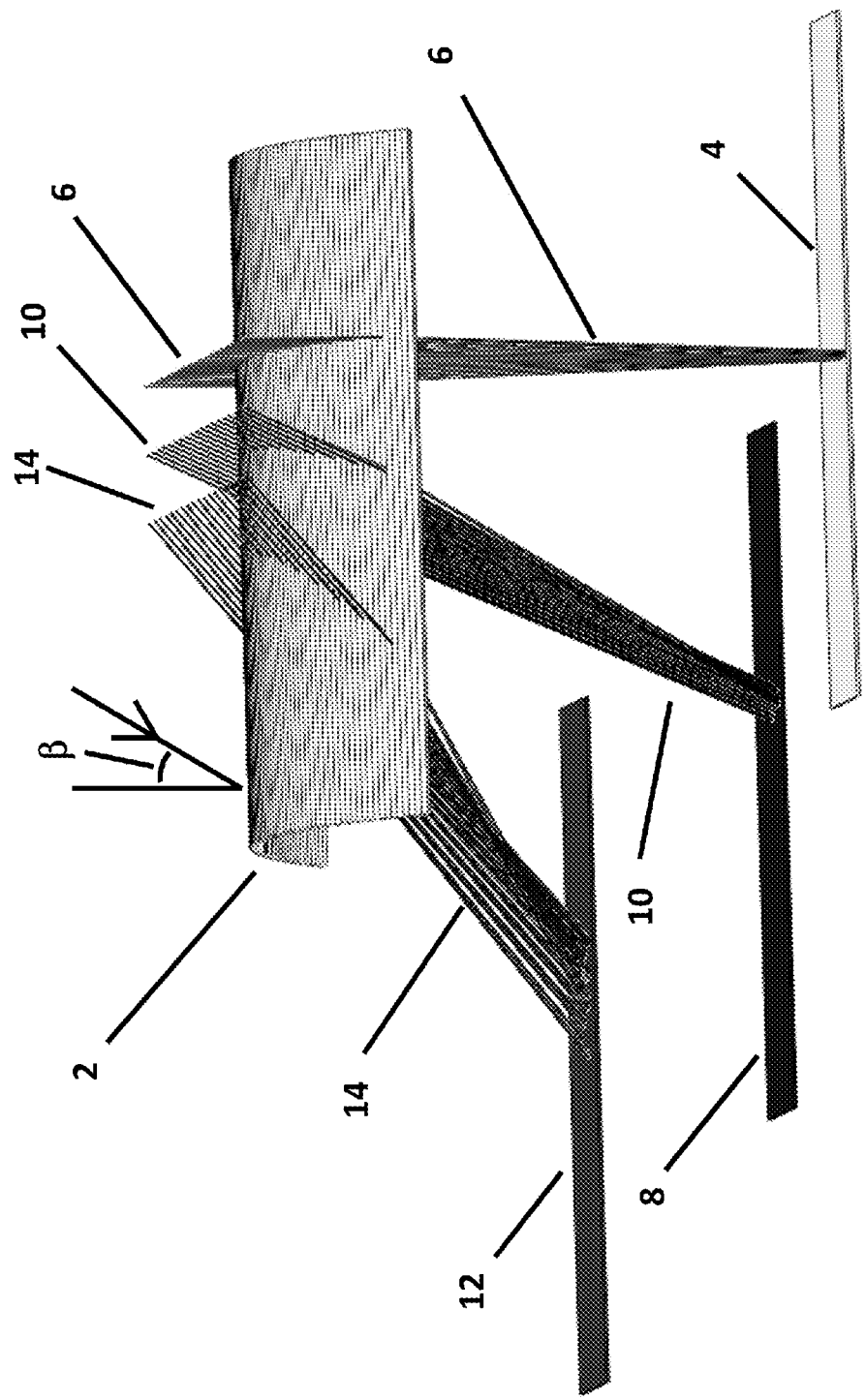

FIG. 2 shows another perspective view of the new Fresnel lens solar concentrator with its articulating energy receiver in three possible positions, corresponding to three example values of the longitudinal solar incidence angle, namely 0 degrees, 25 degrees, and 50 degrees. FIG. 2 shows a more side-on view than FIG. 1 which shows a more isometric view. FIG. 2 also presents the definition of the longitudinal solar ray incidence angle, often called the beta angle (or β-angle) by those of ordinary skill in the art of space solar arrays.

Figure 3:
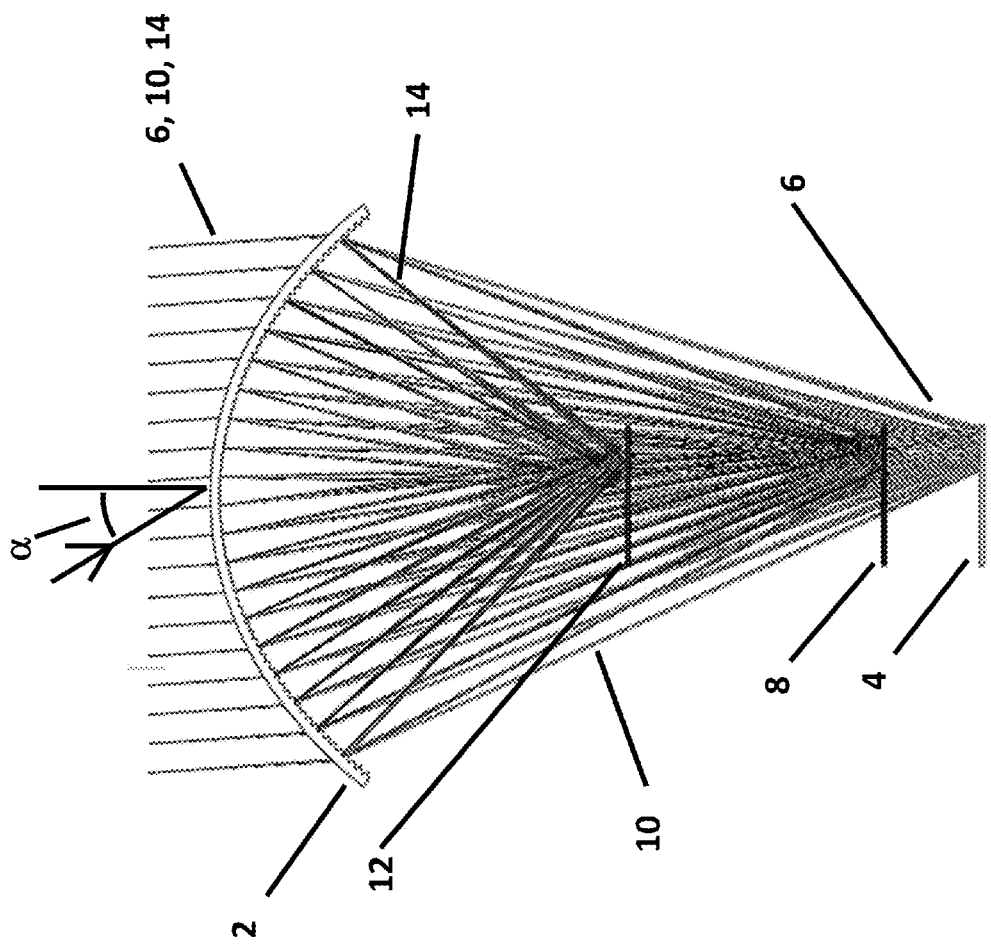

FIG. 3 shows another end view of the new Fresnel lens solar concentrator with its articulating energy receiver in three possible positions, corresponding to three example values of the longitudinal solar incidence angle, namely 0 degrees, 25 degrees, and 50 degrees. FIG. 3 also presents the definition of the lateral solar ray incidence angle, often called the alpha angle (or α-angle) by those of ordinary skill in the art of space solar arrays. FIG. 3 clearly shows the large variation in the best lens-to-receiver vertical distance to provide the best focus of sunlight onto the energy receiver. FIG. 3 also clearly shows the lateral offset in the position of the best focus relative to the center of the energy receiver due to the 4 degree alpha angle (α angle) for these examples. Note that the best focus is to the right side of the center of the energy receiver for all three beta angles (β angles). Note also that the vertical movement needed to position the energy receiver in the best focus is non-linear, with the 0 degree and 25 degree beta angle (β angle) receiver locations much closer to each other than the 25 degree and 50 degree beta angle (β angle) receiver locations are to one another. The energy receiver widths shown in FIG. 3 are more than 75% narrower than the lens aperture width. In fact, for the example cases shown in FIG. 3, the concentration ratio (CR) is 4.2×, corresponding to the lens aperture width divided by the energy receiver width. Note from the ray traces shown in FIG. 3 that all the solar rays focused by the lens intercept the energy receiver for all three values of beta angle (β angle). Therefore, the lens with articulating receiver provides acceptable focusing for the full range of beta angles (β angles) from 0 degrees to 50 degrees, and for the 4 degree alpha angle (α angle) for this example embodiment of the new invention. It will be apparent to one of ordinary skill in the art that the lens and articulating receiver will also provide acceptable focusing for beta angles (β angles) of the opposite sign (−25 degrees and −50 degrees) and for alpha angles (α angles) from −4 degrees to +4 degrees.

The lens thickness and prism sizes have been greatly exaggerated in FIG. 3, as in the earlier FIGS. 1 and 2. In fact, all three figures are the same three-dimensional drawing, shown from different viewpoints.

The Fresnel lens shown in FIGS. 1, 2, and 3 is not a conventional Fresnel lens. Instead, its shape and its prismatic geometry have been selected to provide near-optimal optical performance for the example ranges of alpha angles (α angles) and beta angles (β angles) of ±4 degrees and ±50 degrees, respectively. The method of selecting the best lens design for a given range of alpha and beta angles (α and β angles) is shown schematically in FIG. 4. In general, for a smooth continuous Fresnel lens geometry, with the prismatic pattern on the interior surface and a smooth exterior surface, the outermost prisms at the edges provide the widest spread of focused light in the receiver plane. Therefore, these outermost prisms are generally the most critical in defining the concentrating optical performance of the lens. The key geometrical and ray trace parameters are therefore shown for these outermost prisms in FIG. 4.

Figure 4:
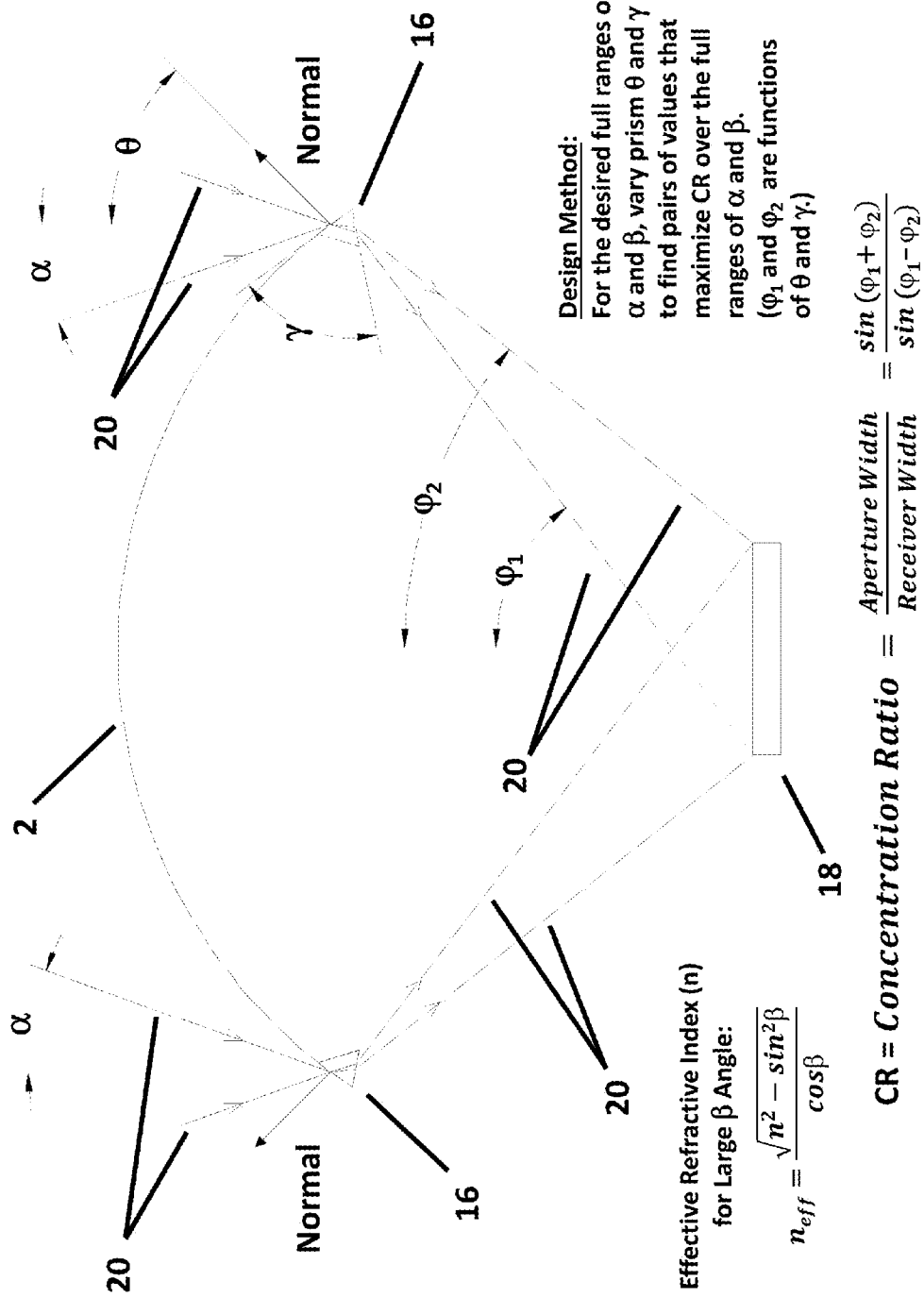

For good optical performance, the energy receiver should be wide enough to intercept and collect the rays coming from the full range of alpha angles and beta angles (α angles and β angles). Those of ordinary skill in the art of lens design will know how to calculate the refraction of incident rays through the outermost prisms and on to the energy receiver, for the full range of alpha and beta angles (α and β angles). To minimize mass and cost of the energy receiver, it is generally best to minimize the width of the energy receiver, which is the same as to maximize the concentration ratio for a given lens aperture width. FIG. 4 presents an important equation related to the concentration ratio in terms of the final refracted ray angles. FIG. 4 also presents an important equation regarding the effective refractive index of the lens material for large beta angles (β angles). Those of ordinary skill in the art of lens design will know that the optical strength (effective refractive index) increases with increasing beta angle (β angle). This is why the best focus moves closer to the lens for larger beta angles (β angles) as shown clearly in FIG. 3.

FIG. 4 summarizes the outer prism design optimization technique, which is to vary the two critical angles, corresponding to prism orientation angle and prism apex angle, and find the pair of angles which maximize concentration ratio for the full range of alpha and beta angles (α and β angles) expected to be encountered by the lens-receiver system in its normal operation. A computer program or a spreadsheet model can be used to perform the refraction calculations to find the best outer prism design in terms of maximizing concentration ratio. However, one of ordinary skill in the art of lens design will also know how to calculate the reflection losses for refracted rays, and will know that such losses increase with increasing angles of incidence of rays onto lens surfaces. This reflection loss phenomenon will limit the amount of curvature of the final lens for good throughput optical efficiency.

Figure 5:
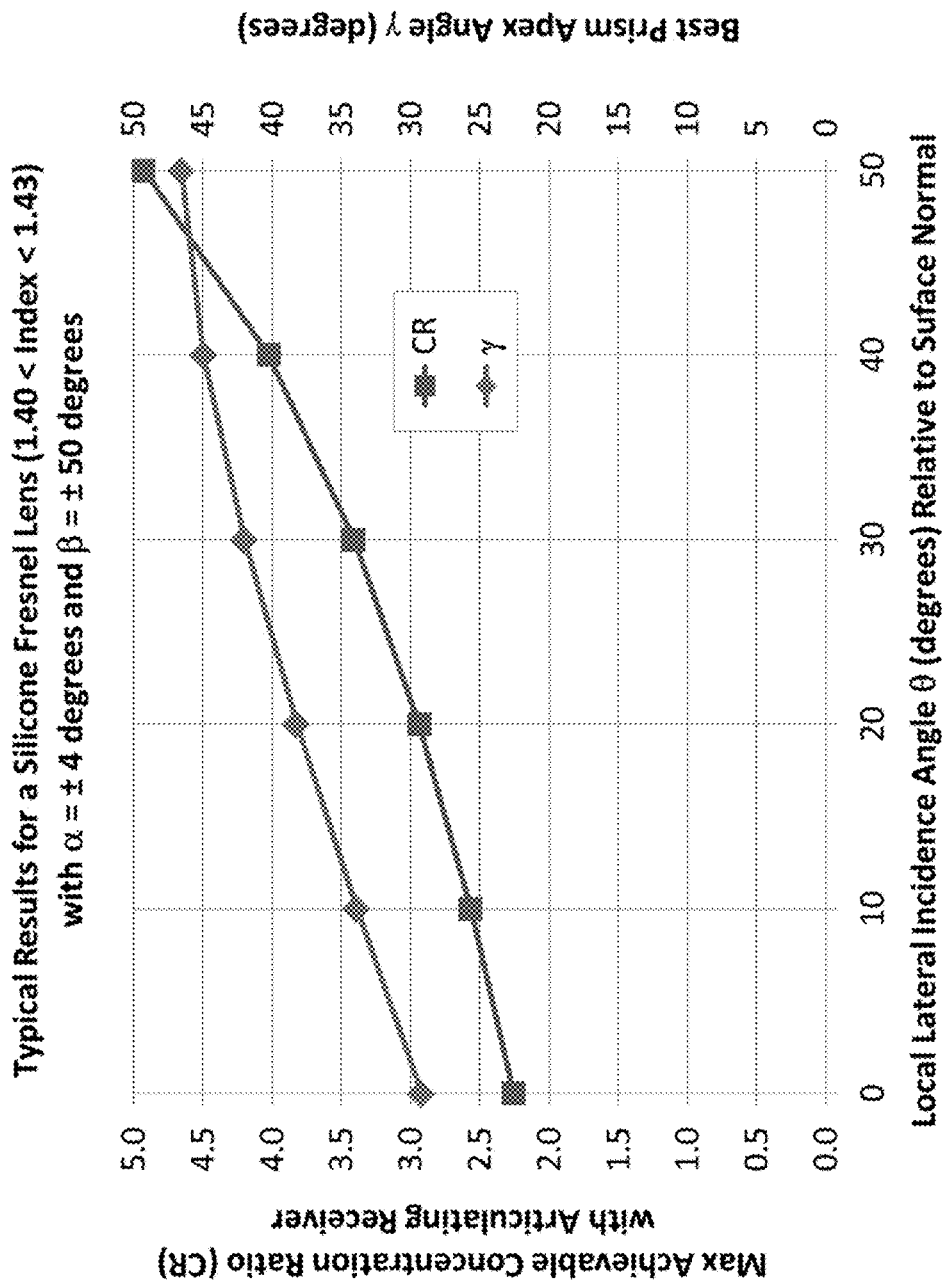

FIG. 5 shows typical results of the optimization analysis depicted in FIG. 4, for an example desired range of alpha and beta angles (α and β angles) and for an assumed silicone rubber lens material. For the highest efficiency multi junction photovoltaic cells operating in space sunlight, wavelengths from about 350 nm to about 2,000 nm need to be efficiently focused by the lens and collected by the photovoltaic receiver. For the preferred space lens material of silicone rubber (for example, Dow Corning DC 93-500®), the refractive index varies from about 1.43 to about 1.40 over this range. So rays of sunlight from the all portions of the solar disk (0.53 degree angular diameter at the distance of the earth from the sun) offset by alpha angles (α angles) of ±4 degrees and further offset by beta angles (β angles) of ±50 degrees need to be focused onto the photovoltaic energy receiver for the full range of wavelengths and corresponding refractive index values mentioned above, for the example case summarized in FIG. 5. Note that higher concentration ratios are achievable with larger local lateral incidence angles relative to the surface normal. This means that lenses of greater convex curvature generally provide higher concentration than flatter lenses. FIG. 5 only shows results up to 50 degrees of local lateral incidence angle relative to the local surface normal, because larger values for the local lateral incidence angle correspond to unacceptable reflection losses for this example case. The combination of 50 degree beta angle (β angle) and 50 degree local lateral incidence angle together correspond to a total incidence angle (including lateral and longitudinal components) of 66 degrees, which is very large from a reflection loss consideration.

Note from FIG. 5 that a concentration ratio of nearly 5× is possible with a 50 degree local lateral incidence angle. However, it is generally desirable to introduce other effects into the lens design, including flux smoothing and color mixing, which further reduce the achievable concentration ratio. The previously shown ray trace results in FIGS. 1, 2, and 3 include color mixing and flux smoothing, and thereby show only a 4.2× final concentration ratio. Color mixing and flux smoothing are phenomena that those of ordinary skill in the art will fully understand and be able to apply to the new invention.

DETAILED DESCRIPTION & BEST MODE OF IMPLEMENTATION

The present invention is best understood by referring to the attached drawings, which shows a preferred embodiment. Referring to FIG. 1, the arch-shaped linear Fresnel lens 2 is configured in its shape and in the geometry of the prisms on its inner surface to focus incident solar rays onto an articulating narrower energy receiver while the system operates under a variety of different longitudinal solar ray angles of incidence (β angles). When the β angle is 0 degrees, the energy receiver 4 is positioned at its greatest distance from lens 2 so that solar rays 6 are focused properly onto receiver 4. When the β angle is 25 degrees, the energy receiver 8 is positioned closer to lens 2 so that solar rays 10 are focused properly onto receiver 8. When the β angle is 50 degrees, the energy receiver 12 is positioned still closer to lens 2 so that the solar rays 14 are properly focused onto receiver 12. The configuration of the lens 2 must be designed using analytical ray trace models to provide acceptable focusing over the full range of desired β angles, with such configuration representing a key part of the present invention.

Referring next to FIG. 2, this drawing shows a slightly different view of the same basic elements of the preferred embodiment previously shown in FIG. 1, namely the lens 2, and the energy receiver 4, 8, 12, in different positions for different longitudinal incidence angle (β angle) solar rays 6, 10, 14. FIG. 2 also shows the basic definition of the longitudinal incidence angle, also known as the beta angle or β angle. For the example embodiment of the new invention shown in FIG. 2, the three sets of solar rays 6, 10, and 14 arrive at the outside of the lens with 0, 25, and 50 degrees of β angle. The energy receiver locations 4, 8, and 12 represent the best focus locations for these three values of β angle. The thickness of the lens 2 and the size of the prisms in lens 2 have been greatly exaggerated to make the geometry easier to understand. In an actual space solar array lens, the lens thickness would typically be very small (<250 microns) and the prisms would be microscopic in size (<100 microns tall or wide).

For clarity, FIG. 2 shows different longitudinal energy receiver positions 4, 8, and 12, but the critical articulation of these receiver positions is not longitudinal but vertical. One of ordinary skill in the art of lens design will recognize that the longitudinal positions of the receiver 4, 8, and 12 can all be the same, but the vertical position defined by the distance from the receiver 4, 8, and 12 to the lens 2 must vary to maintain the best focus over a wide range of β angles. The present invention includes the vertical articulation of the receiver 4, 8, 12 relative to the lens 2 to provide acceptable focusing over a wide range of β angles for solar rays 6, 10, 14. Longitudinal articulation can be included within the scope and spirit of the present invention, but it is not as critical an ingredient as vertical articulation, which is essential for proper focusing with large variations in β angle.

Referring next to FIG. 3, this drawing shows a different view, namely an end view, of the same basic elements of the preferred embodiment previously shown in FIG. 1 and FIG. 2, namely the lens 2, and the energy receiver 4, 8, 12, in different positions for different longitudinal incidence angle (β angle) solar rays 6, 10, 14. FIG. 2 also shows the basic definition of the lateral solar ray incidence angle, also known as the alpha angle or α angle. For the example embodiment shown in FIG. 3, the α angle is 4 degrees, causing the solar rays 6, 10, and 14 to move off-center on the receiver in all three receiver positions 4, 8, and 12. Since the solar rays 6, 10, 14 are arriving from an angular position tilted toward the left of a vertical line in FIG. 3, they are focused to the right of the center of the receiver 4, 8, 12 due to this 4 degree α angle.

One critical feature of the present invention is shown clearly in FIG. 3, namely that the lens 2 configuration, including its shape and its prismatic pattern geometry, and the receiver 4, 8, 12 width and articulating position have been carefully designed to work well together over the full range of α angles (±4 degrees) and β angles (±50 degrees) selected for this example embodiment. Those of ordinary skill in the art of lens design will understand that the lens 2 and receiver 4, 8, and 12 configuration and positioning will be different for other ranges of α angles and β angles, but that these other embodiments will fall within the scope and spirit of the teachings of the present invention.

Referring next to FIG. 4, which is a cross-sectional schematic, the new method of designing the lens 2 to work well with an articulating receiver 18 is summarized, including two important equations related to the design. Since the outermost prism 16 in a Fresnel lens 2 generally determines the required width of the energy receiver 18 to intercept the refracted and focused solar rays 20, this outermost prism 18 is generally the most critical element of the lens 2. FIG. 4 shows the lens in a cross-sectional view which does not show the longitudinal solar ray incidence angle, also known as the $\beta$ angle, previously shown in FIG. 2. But the desired $\beta$ angle is critical to the lens 2 design in FIG. 4, since the effective refractive index, $n_{\it eff}$, of the lens material follows the equation shown in FIG. 4 which is a strong function of $\beta$ angle as well as the real refractive index of the lens material, n. As one of ordinary skill in the art will know, the effective refractive index increases with increasing $\beta$ angle, causing the best focus to shift upward closer to the lens with increasing $\beta$ angle. While only one symbol is shown for $\beta$ and n in the equation in FIG. 4, it should be understood that all desired values of $\beta$ and n must be considered. For example, if it is desired for the lens to operate over a range of $\beta$ angles from ±50 degrees, the focusing properties of the lens must be considered over this full range, especially considering 0 degrees and 50 degrees, since these values will correspond to the longest and shortest distances from the lens 2 to the energy receiver 18, respectively. Similarly, if the lens material is silicone rubber, namely Dow Corning DC 93-500®, and the energy receiver includes multi-junction photovoltaic cells which convert sunlight to electricity over a wavelength range of about 350 nm to about 2,000 nm, then the real refractive index, n, will vary from about 1.43 to about 1.40, and this full range must be considered in the equations and analysis summarized in FIG. 4.

The design method summarized in FIG. 4 is to first define the desired ranges of operation of the solar ray incidence angles, including the lateral incidence angle, $\alpha$ angle, and the longitudinal incidence angle, $\beta$ angle. Then the refraction of the outermost prism 16 is considered with variations in its two defining angles, namely the prism orientation angle $\theta$ and the prism apex angle $\gamma$, both shown in FIG. 4. These two prism angles $\theta$ and $\gamma$ are varied over the full range of desired $\alpha$ and $\beta$ solar ray angles to find the refracted ray angle $\phi_1$ and $\phi_2$ that maximize the concentration ratio CR using the equation shown in FIG. 4 for each candidate pair of $\theta$ and $\gamma$. For each specific candidate value of $\theta$, there is one value of $\gamma$ that maximizes CR for the desired full ranges of $\alpha$ and $\beta$. This is the best value for $\gamma$ since maximizing CR is desirable because this minimizes the area, mass, cost, and complexity of the energy receiver, which is generally the most complex, heaviest and the greatest cost element in a space solar array.

The method of configuring a lens 2 to work with an articulating energy receiver 18 over a wide range of $\beta$ angles and a smaller but still significant range of $\alpha$ angles taught in FIG. 4 can be applied to a variety of different lens 2 and receiver 18 applications. For example, one space solar array designer may desire to use a flat Fresnel lens, which implies that $\theta$ will be zero not only for the outermost prism 16 but for all the prisms in the lens. Another designer may want to use the better-performing arched lens shape, but will want to limit the value of $\theta$ so that the reflection loss from the outer lens surface near the outermost prism 16 is not too great. For either case and for many other cases which those of ordinary skill in the art of lens design will extrapolate from the method shown in FIG. 4, once the outermost prism 16 has been selected, the rest of the prisms in the lens will be relatively simple to design, since their key requirement will correspond to refracting the solar rays 20 onto the same energy receiver 18 onto which the outermost prism 16 was designed to place its rays. Since the incidence angles $\phi_1$ and $\phi_2$ of the solar rays onto the receiver 18 will be smaller for all of the interior prisms in the lens compared to the outermost prism 16, the extent of the spread of rays 20 across the receiver 18 width will be smaller for the interior prisms than for the outermost prisms 16. Regarding the selection of $\theta$ and $\gamma$ angles for the interior prisms in the lens 2, if the lens 2 is arched with the outermost prism having an angle $\theta$ of for example 45 degrees, then all the interior angles $\theta$ will be smaller than 45 degrees, and an acceptable arc shape for lens 2 can be selected by simply fitting a cylinder for example to the two outermost prisms 16. Alternatively, any other closed arch shape, for example an ellipse, for the lens 2 can be fit to the two outermost prisms 16. After the arc or arch shape has been selected, then the $\theta$ angles will be known all across the lens. As anyone of ordinary skill in the art of lens design will know, once the $\theta$ angles are known for the interior prisms, the application of the fundamental refraction equations (also known as the vector form of Snell's law) will lead to a simple selection of the $\gamma$ angle for each interior prism in the lens 2.

Referring next to FIG. 5, this graph shows the results of the method described in FIG. 4 to select the new lens for use with an articulating receiver for a wide range of $\beta$ angles and an appreciable range of $\alpha$ angles. For the results shown in FIG. 5, which are exemplary only, since many other cases also exist, the selected ranges of solar ray incidence angles are $-4$ degrees$<\alpha<+4$ degrees and $-50$ degrees$<\beta<+50$ degrees. Two curves are plotted in FIG. 5, both as functions of the local lateral incidence angle $\theta$ previously shown in FIG. 4. Firstly, the maximum achievable concentration ratio CR is plotted using the left vertical axis. Concentration ratio CR is defined as the lens aperture width divided by the articulating energy receiver active width, as previously described in FIG. 4. Secondly, the best prism apex angle $\gamma$ is plotted using the right vertical axis. The best prism apex angle $\gamma$ is defined as the angle $\gamma$ which provides the maximum concentration ratio CR for a given value of $\theta$ using the method taught in FIG. 4.

Note in FIG. 5 that the achievable concentration ratio CR increases with increasing $\theta$ values. This trend implies for the example case at least that arched lenses provide higher CR than flat lenses, which use a zero value for $\theta$ since they are flat. In addition, this trend implies that more severely curved lenses provide higher CR than less severely curved lenses at least for the example case shown in FIG. 5. But increasing $\theta$ values lead to higher reflection losses from the outer surface of the lens, limiting the practical upper limit of $\theta$ values. Therefore, FIG. 5 is only plotted up to 50 degrees of $\theta$ value, since larger values are of less practical importance than values of 50 degrees and less for the example case shown.

Note in FIG. 5 that the right-most data points plotted in the graph correspond to a concentration ratio CR of almost 5×, and to a prism apex angle of about 47 degrees. This combination of prism angles $\theta$ and $\gamma$ were selected for the outermost prism design for the lens 2 in FIGS. 1, 2, and 3, which lens 2 works very well in combination with the articulating energy receiver 4, 8, 12, with solar rays coming from a variety of $\beta$ angles including 0 degrees, 25 degrees, and 50 degrees as shown by solar rays 6, 10, 14. The shape of the lens 2 in FIGS. 1, 2, and 3 was selected by fitting a continuous arch shape to the outermost prisms with the $\theta$ and $\gamma$ gamma angles selected to match the right-most data points in FIG. 5. The energy receiver 4, 8, 12 in FIGS. 1, 2, and 3 was sized to be slightly larger than the 5× concentration ratio CR of the right-most data points in FIG. 5 to allow for color-mixing features to be added to the lens, thereby reducing the concentration ratio CR to about 4.2×.

In summary, FIGS. 1, 2, and 3 show a lens 2 configured to work well optically with an articulating energy receiver 4, 8, 12 in focusing solar rays 6, 10, 14 onto energy receiver 4, 8, 12 in the presence of large solar ray $\beta$ angles and smaller but still significant solar ray α angles. FIG. 4 summarizes the fundamental optical design method, and FIG. 5 presents typical results from this design method, including as rightmost data points in FIG. 5 the preferred embodiment shown in FIGS. 1, 2, and 3.

The present invention can be used as an improved version of the earlier stretched lens array (SLA) invention of Reference 1 but now provides a much better tolerance for large β angles than the original SLA. For the preferred embodiment shown in FIGS. 1, 2, and 3, the polymeric lens 2 can be made from a space-qualified silicone rubber such as Dow Corning DC 93-500 material, with a total thickness of about 0.010 inch (0.25 mm). Such lenses in line-focus form are described in References 2 and 3. In the present invention, the lens 2 will be configured as taught in FIG. 4 and as described above to work with large solar β angles. For space applications, the lens should be coated on its outside surface with an ultraviolet rejection (UVR) coating which blocks the vacuum ultraviolet (VUV) wavelengths below 200 nm, since these wavelengths can darken the silicone lens material as described in References 2 and 3.

The energy receiver 4, 8, 12 will often be configured as a photovoltaic receiver assembled from high-efficiency multi-junction solar cells, such as the three-junction devices presently being made by Spectrolab, a California-based unit of Boeing Company, or Emcore, a public company in New Mexico, or several other companies in the world. Many companies are working on four-junction and six-junction solar cells for the future, using a configuration called inverted metamorphic (IMM), and these cells would be ideally suited for use in the energy receiver 4, 8, 12 in the present invention. Persons of ordinary skill in the art of space solar arrays will be familiar with the construction and manufacture of photovoltaic receivers for application in the present invention.

The size of the lens 2 is typically selected based on thermal considerations, specifically the thickness and mass of a radiator which is often used to dissipate waste heat, as discussed in References 2 and 3. Since radiator thickness and mass increase with increasing aperture size, the lens width is generally selected at less than 10 cm, as discussed in References 2 and 3.

The Fresnel lens 2, which comprises a refractive optical element, would perform best if its prismatic pattern includes color-mixing features as taught in U.S. Pat. No. 6,031,179, Reference 4. While the lens assembly could be deployed in a flat form as opposed to an arched form, and still clearly fall within the scope of this present invention, a convex arch-shaped lens provides superior optical performance for the reasons described above, and in References 2 and 3, and therefore represents the preferred embodiment.

Referring to FIGS. 1, 2, and 3, the present invention including lens 2 and articulating energy receiver 4, 8, 12 will typically be deployed in a larger array of lenses and energy receivers. FIGS. 1, 2, and 3 show only one lens 2 and one receiver 4, 8, 12, but those of ordinary skill in the art of space solar arrays will understand that actual flight arrays will consist of hundreds or thousands of lenses and energy receivers.

In certain space solar array configurations such as the ATK SquareRigger platform described in Reference 2, the layer of lenses 2 can be supported as stretched blankets above a second stretched blanket containing the energy receivers 4, 8, 12. The dual stretched blanket approach can be very light in weight and can be stowed in a very compact volume with the lens blanket and the radiator blanket stowed in close proximity to one another for launch into orbit. For such a deployment and support approach, the blanket of lenses 2 can be moved vertically closer to the blanket of receivers 4, 8, 12 to provide optimal optical performance for increasing values of solar β angles. Shifting lens and receiver blanket distances represents on potential method of implementing the present invention.

The new invention, including the embodiment shown in FIG. 1 and FIG. 2 and FIG. 3, and many other embodiments which can be conceived by those of ordinary skill in the art, offer many advantages over other space solar photovoltaic arrays, including other concentrating arrays which use mirrors or lenses to focus sunlight onto photovoltaic cells. The new invention provides unprecedented performance and cost advantages in all of the critical performance metrics for space solar arrays, including lower cost ($/Watt of array power output), higher specific power (Watts/kilogram of array mass), higher stowed power (Watts/cubic meter of launch volume), improved photovoltaic cell radiation hardness (due to smaller cell sizes, allowing thicker radiation shielding at lower mass penalty), and higher voltage operation (again due to the smaller cell sizes, allowing thicker dielectric insulation at lower mass penalty). The small size of the photovoltaic cells reduces the area, mass, and cost of these expensive devices compared to other space solar arrays, including planar one-sun arrays and other concentrator arrays which typically operate at lower concentration ratio, such as the ATK CellSaver® array which provides about 1.8× concentration.

The present invention can be implemented as a stretched lens array (SLA). As highlighted in References 2 and 3, SLA offers spectacular performance for many space missions, especially those requiring high power, high voltage, and high radiation hardness. Solar electric propulsion (SEP) is one such application where SLA offers unparalleled performance and cost, as discussed in Reference 3. With even better performance and cost metrics than the earlier SLA, because of the tolerance of the new invention to large solar β angles, the present invention can use single-axis sun tracking instead of dual axis sun tracking, thereby representing a new threshold of space solar array performance and cost.

While one primary embodiment of the new invention is configured for ultra-light-weight solar power arrays for spacecraft, the same lens with articulating energy receiver technology can offer significant benefits for ground-based solar power systems, and other embodiments of the new invention for terrestrial power are included in the scope and spirit of the invention. Indeed, a terrestrial spin-off of the original SLA invention described in U.S. Pat. No. 6,075,200 recently won a prestigious 2012 R&D 100 Award, as described under the SolarVolt Module at this NASA web site: https://rt.grc.nasa.gov/2012/nasa-glenn-advancements-green-energy-lightweight-materials-win-rd-100-awards/. The present new invention will enable improved terrestrial solar concentrators as well as improved space solar concentrators.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

REFERENCES (INCORPORATED HEREIN BY REFERENCE)

1. Mark J. O'Neill, "Stretched Fresnel Lens Solar Concentrator for Space Power," U.S. Pat. No. 6,075,200, Jun. 13, 2000.
2. Mark J. O'Neill et al., "Stretched Lens Array SquareRigger (SLASR) Technology Maturation," 19th Space Photovoltaic Research and Technology Conference (SPRAT XIX), Sep. 20 to 22, 2005, Cleveland, Ohio.
3. Mark J. O'Neill et al., "Stretched Lens Array (SLA) for Solar Electric Propulsion (SEP)," 20th Space Photovoltaic Research and Technology Conference (SPRAT XX), Sep. 25-27, 2007, Cleveland, Ohio.
4. Mark J. O'Neill, "Color Mixing Lens for Solar Concentrator System and Methods of Manufacture and Operation Thereof," U.S. Pat. No. 6,031,179, Feb. 29, 2000.

I claim:

1. A solar energy concentrator for a spacecraft comprising:
    an optical element comprising a lens assembly further comprising a thin film having microscopic prisms molded with said thin film to form a line-focus Fresnel lens for collecting and refracting sunlight into a linear focus of concentrated sunlight along a longitudinal axis, the at least one optical element having an optical axis corresponding to a zero degree lateral ($\alpha$) angular direction;
    a receiver element mechanically coupled with said optical element and further comprising an articulating mechanism for moving said receiver element in relation to said optical element, said receiver element for accepting the linear focus of concentrated sunlight passing through said optical element, the receiver element spaced apart from said optical element refracts to said receiver element substantially all sunlight passing through said optical element,
    said concentrator configured for only single-axis sun-tracking for focusing sunlight for energy capture and conversion in the presence of longitudinal incidence angles ($\beta$) up to approximately 51 degrees, wherein the single-axis sun tracking components corresponds to a lateral ($\alpha$) angular direction;
    said optical element and said receiver element are connected such that said microscopic prisms produce the linear focus of concentrated sunlight onto the receiver element under sun angle conditions comprising longitudinal ($\beta$) solar ray incidence angles in the full range from zero degrees to plus or minus 50 degrees;
    said optical element and said receiver element actuating said articulating mechanism for translating relative to one another only in a first direction, parallel to the optical axis, and a second direction, parallel to the longitudinal axis, for maintaining the linear focus of concentrated sunlight onto the receiving element through changes in incidence angles of the sunlight, wherein said optical element and said receiver element cooperate for achieving a focus on said receiver element such that, when $\beta$ ranges from zero degrees to plus or minus 50 degrees, said optical element refracts essentially all received optical energy onto said receiver element;
    wherein said optical element and said receiver element are connected such that an outer surface slope angle ($\theta$) relative to said optical axis and the prism angle ($\gamma$) of the outermost prism in the lens are determined by performing parametric ray trace analyses over the full range of $\beta$ angles (zero to +/−50 degrees) and over the full range of $\alpha$ angle errors, while recording and comparing the maximum ($\phi_1$) and minimum ($\phi_2$) refracted ray angles for each pair of $\delta$ and $\gamma$ angles, and further wherein a pair of $\theta$ and $\gamma$ angles are selected for maximizing the achievable geometric concentration ratio of at least 4 for said articulating receiver element, and further wherein said geometric concentration ratio (GCR) behaves according to the following equation:

$$GCR=\sin(\phi_1+\phi_2)/\sin(\phi_1-\phi_2),$$

and further wherein the lens shape of said optical element enables the outermost prism to match the selected $\theta$ angle.

2. The solar energy concentrator of claim 1, wherein said receiver element comprises a photovoltaic cell.

3. The solar energy concentrator of claim 1, wherein said optical element comprises silicone.

4. The solar energy concentrator of claim 1, wherein said solar energy concentrator comprises two displaced layers in a space solar array, the first layer comprising said optical element, the second layer comprising said receiver element, wherein a distance between said first layer and said second layer is variable responsive to changes in incidence angles of sunlight, wherein the optical element comprises a center and the receiver element comprises a center, and wherein the center of the optical element and the center of the receiver element are aligned along the optical axis.

5. A solar energy concentrator for a spacecraft comprising:
    a solar array configured for only single-axis sun-tracking, the solar array comprising:
    an optical element comprising a lens assembly further comprising a thin film having microscopic prisms molded with said thin film to form a linear-focus Fresnel lens, said linear-focus defining a longitudinal axis, said optical element configured to produce a linear focus of sunlight in the presence of longitudinal incidence angles of incident solar rays, said linear-focus being produced at different locations in space relative to said optical element depending on said longitudinal incidence angle;
    a receiver element comprising a photovoltaic cell for receiving energy from the linear focus of sunlight, said receiver element mechanically coupled with said optical element and further comprising an articulating mechanism for moving said receiver element in relation to said optical element, said receiver element for accepting the linear focus of concentrated sunlight passing through said optical element, the receiver element spaced apart from said optical element refracts to said receiver element;
    said array configured to focus sunlight for energy capture and conversion in the presence of longitudinal incidence angles ($\beta$) up to approximately 51 degrees wherein the single-axis sun tracking components correspond to a lateral ($\alpha$) angular direction;
    said optical element and said receiver element cooperatively configured for using said microscopic prisms for respectively producing and accepting the linear focus of concentrated sunlight under sun angle conditions comprising longitudinal ($\beta$) solar ray incidence angles in the full range from zero degrees to plus or minus 50 degrees;
    said optical element and said receiver element actuating said articulating mechanism for translating relative to one another only in a first direction, parallel to the optical axis, and a second direction, parallel to the longitudinal axis, for maintaining the linear focus of concentrated sunlight onto the receiving element through changes in incidence angles of the sunlight, wherein said optical element and said receiver element cooperate for achieving a focus on said receiver element such that, when β ranges in the full range from zero degrees to plus or minus 50 degrees, said optical element refracts essentially all received optical energy onto said receiver element; and wherein said optical element and said receiver element are connected such that an outer surface slope angle (θ) relative to said optical axis and the Prism angle (γ) of the outermost prism in the lens are determined by performing parametric ray trace analyses over the full range of β angles (zero to +/−50 degrees) and over the full range of α angle errors, while recording and comparing the maximum ($\phi_1$) and minimum ($\phi_2$) refracted ray angles for each pair of θ and γ angles, and further wherein a pair of θ and γ angles are selected for maximizing the achievable geometric concentration ratio of at least 4 for said articulating receiver element, and further wherein said geometric concentration ratio (GCR) behaves according to the following equation:

$$GCR=\sin(\phi_1+\phi_2)/\sin(\phi_1-\phi_2),$$

and further wherein the lens shape of said optical element enables the outermost prism to match the selected θ angle.

6. The solar energy concentrator of claim 5, wherein said optical element and said receiver element are configured to respectively produce and accept a focus of concentrated sunlight under sun angle conditions comprising longitudinal (β) solar ray incidence angles larger than 40 degrees and lateral (α) solar ray incidence angles less than 4 degrees.

7. The solar energy concentrator of claim 5, wherein said optical element comprises silicone.

8. A solar energy concentrator for a spacecraft comprising:
a Fresnel lens optical element comprising a lens assembly further comprising a thin film having a plurality of microscopic prisms configured to focus incident sunlight into a line focus of concentrated sunlight, said line focus defining a longitudinal axis, and having an optical axis corresponding to a zero degree lateral (α) angular direction;
a receiver element for accepting the line focus of concentrated sunlight, said receiver element positioned apart from said Fresnel lens optical element, said receiver element mechanically coupled with said optical element and further comprising an articulating mechanism for moving said receiver element in relation to said optical element, said receiver element for accepting the linear focus of concentrated sunlight passing through said optical element, the receiver element spaced apart from said optical element refracts to said receiver element substantially all sunlight passing through said optical element;
wherein said solar energy concentrator is configured for only single-axis sun-tracking for use with a Fresnel lens assembly for focusing sunlight for energy capture and conversion in the presence of longitudinal incidence angles (β) up to approximately 51 degrees, wherein the single-axis sun tracking components correspond to a lateral (α) angular direction; and
wherein said Fresnel lens optical element and said receiver element are configured to respectively produce and accept said line focus of concentrated sunlight under sun angle conditions comprising longitudinal (β) solar ray incidence angles in the full range of 0 to 50 degrees and single-axis sun-tracking errors of less than 4 degrees, and wherein said receiver element and said Fresnel lens optical element configured to translate only parallel to an optical axis and parallel to the longitudinal axis, to maintain the line focus of concentrated sunlight onto said receiver element through changes in longitudinal incidence angles of incoming sunlight; and wherein said optical element and said receiver element are connected such that an outer surface slope angle (θ) relative to said optical axis and the prism angle (γ) of the outermost prism in the lens are determined by performing parametric ray trace analyses over the full range of β angles (zero to +/−50 degrees) and over the full range of α angle errors, while recording and comparing the maximum ($\phi_1$) and minimum ($\phi_2$) refracted ray angles for each pair of θ and γ angles, and further wherein a pair of θ and γ angles are selected for maximizing the achievable geometric concentration ratio of at least 4 for said articulating receiver element, and further wherein said geometric concentration ratio (GCR) behaves according to the following equation:

$$GCR=\sin(\phi_1+\phi_2)/\sin(\phi_1-\phi_2),$$

and further wherein the lens shape of said optical element enables the outermost prism to match the selected θ angle.

9. The solar energy concentrator of claim 8, wherein said Fresnel lens optical element comprises a substantially arched shape.

10. The solar energy concentrator of claim 8, wherein said Fresnel lens optical element comprises a substantially flat shape.

11. The solar energy concentrator of claim 8, wherein said concentrator comprises two displaced layer in a space solar array, the first layer comprising said Fresnel lens element, the second layer comprising said receiver element, wherein a distance between said first layer and said second layer is varied in response to changes in the longitudinal (β) solar ray incidence angles.

12. The concentrator of claim 8, wherein said optical element and said receiver element further configured to translate in a direction parallel to a longitudinal axis.

13. The energy concentrator of claim 8, wherein said optical element comprises a plurality of lenses arranged in an array.

14. The energy concentrator of claim 8, wherein said receiver element comprises a plurality of photovoltaic cells arranged in an array.

15. The energy concentrator of claim 8, wherein the single-axis tracking provides said optical element with a lateral (α) solar ray incidence angle maintained between −2 degrees and 2 degrees.

16. The energy concentrator of claim 8, wherein the solar array configured for single-axis tracking maintains a lateral (α) solar ray incidence angle between −2 degrees and 2 degrees.

17. A space solar energy concentrator comprising:
a first layer comprising line-focus Fresnel lens elements, said line-focus comprising a longitudinal direction and further comprising a lens assembly further comprising a thin film having microscopic prisms molded with said thin film for collecting and refracting sunlight into a linear focus of concentrated sunlight along a longitudinal axis, the optical element having an optical axis corresponding to a zero degree lateral (α) angular direction; and a second layer comprising an energy receiver element, said receiver element mechanically coupled with said optical element and further comprising an articulating mechanism for moving said receiver element in relation to said optical element, said receiver element for accepting the linear focus of concentrated sunlight passing through said optical element, the receiver element spaced apart from said optical element refracts to said receiver element substantially all sunlight passing through said optical element;

said optical element and said receiver element cooperatively configured for using said microscopic prisms for respectively producing and accepting the linear focus of concentrated sunlight under sun angle conditions comprising longitudinal (β) solar ray incidence angles in the full range from zero degrees to plus or minus 50 degrees;

said optical element and said receiver element actuating said articulating mechanism for translating relative to one another only in a first direction, parallel to the optical axis, and a second direction, parallel to the longitudinal axis, for maintaining the linear focus of concentrated sunlight onto the receiving element through changes in incidence angles of the sunlight, wherein said optical element and said receiver element cooperate for achieving a focus on said receiver element such that, when β ranges in the full range from zero degrees to plus or minus 50 degrees, said optical element refracts essentially all received optical energy onto said receiver element;

the first layer and the second layer being displaced from each other, and said first layer and said second layer being configured to move such that only a displacement distance between the first layer and the second layer is varied responsive to changes in the longitudinal incidence angles of incoming light; and wherein said optical element and said receiver element are connected such that an outer surface slope angle (θ) relative to said optical axis and the prism angle (γ) of the outermost prism in the lens are determined by performing parametric ray trace analyses over the full range of β angles (zero to +/−50 degrees) and over the full range of α angle errors, while recording and comparing the maximum ($\phi_1$) and minimum ($\phi_2$) refracted ray angles for each pair of θ and γ angles, and further wherein a pair of θ and γ angles are selected for maximizing the achievable geometric concentration ratio of at least 4 for said articulating receiver element, and further wherein said geometric concentration ratio (GCR) behaves according to the following equation:

$$GCR = \sin(\phi_1 + \phi_2)/\sin(\phi_1 - \phi_2),$$

and further wherein the lens shape of said optical element enables the outermost prism to match the selected θ angle.

* * * * *